United States Patent
DeBrosse et al.

(10) Patent No.: US 6,351,019 B1
(45) Date of Patent: Feb. 26, 2002

(54) PLANARIZED AND FILL BIASED INTEGRATED CIRCUIT CHIP

(75) Inventors: John K. DeBrosse, Burlington, VT (US); Matthew R. Wordeman, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/585,503

(22) Filed: Jun. 1, 2000

Related U.S. Application Data

(62) Division of application No. 09/154,652, filed on Sep. 17, 1998, now Pat. No. 6,121,078.

(51) Int. Cl.[7] .............................................. H01L 29/00
(52) U.S. Cl. ..................... 257/510; 257/506; 257/288; 257/365; 438/221; 438/353
(58) Field of Search ................... 257/510, 327, 257/288, 365, 503, 506, 528, 919; 438/221, 296, 353

(56) References Cited

U.S. PATENT DOCUMENTS 5,898,205 A  *  4/1999  Lee .............................. 257/355
5,976,949 A  * 11/1999  Chen ........................... 438/427
6,093,631 A  *  7/2000  Jaso et al. ................... 438/618
6,153,918 A  * 11/2000  Kawashima et al. ........ 257/510

FOREIGN PATENT DOCUMENTS

JP    409181159 A  *  7/1997

OTHER PUBLICATIONS

Wolf, Silicon Processing for the VLSI Era, Lattice Press, Second Edition, vol. 1, p. 769.*

* cited by examiner

*Primary Examiner*—Nathan Flynn
*Assistant Examiner*—Scott R Wilson
(74) *Attorney, Agent, or Firm*—Ratner & Prestia; Steven Capella, Esquire

(57) ABSTRACT

An isolation and gate planarization method for an integrated circuit chip and chips designed by the method. The method comprises generating a dummy gate conductor (GC) shape and biasing it to the underlying well. The method may further comprise generating an active area (AA) dummy shape underlying the GC dummy shape. Biasing may be to the same voltage as the underlying well, or may be to a different voltage to create a decoupling capacitor. The biasing may be accomplished by implanting a well contact on an active area shape, the contact being N+ over an N-well or P+ over a P-well.

4 Claims, 4 Drawing Sheets

(Gate Layer Prior Art)

(Gate Layer Prior Art)

PLANARIZED AND FILL BIASED INTEGRATED CIRCUIT CHIP

This application is a divisional of U.S. patent application Ser. No. 09/154,652, filed on Sep. 17, 1998, now U.S. Pat. No. 6,121,078 which has been abandoned.

TECHNICAL FIELD

The present invention relates generally to a method of designing semiconductor devices and more specifically to a method of designing semiconductor devices requiring planarization during fabrication.

BACKGROUND OF THE INVENTION

Shallow Trench Isolation (STI) is a very attractive isolation technology for high-density complementary Metal-Oxide-Semiconductor (CMOS) integrated circuits (ICs) on IC chips. The manufacture of IC chips using STI comprises laying out the desired devices of the circuit on a substrate having wells in the substrate, thus creating "active areas," and then using photomasking and etching processes to etch away trenches of constant depth and varying width between the active areas. Trench widths may vary greatly in relation to the spacing between active devices.

The trenches are then typically filled with a dielectric isolation material such as silicon oxide ($SiO_2$) by a Chemical Vapor Deposition (CVD) process. The dielectric also builds on the active areas, however, so Chemical-Mechanical Polishing (CMP) processes are then used to planarize the chip. Planarization leaves a uniformly flat chip surface with each active area (AA) exposed and surrounded by isolation material. Planarization of dielectric-filled STI trenches of widely varying pattern density is quite difficult, however, because wide trenches may introduce non-uniformities in the CMP step, resulting in depressions or "dishing" in the subsequently planarized surface. To avoid such depressions and thus achieve global or long-range planarization, an additional planarization mask is often used to deposit material in the larger trenches. Local planarization is then achieved by the use of CMP.

In the next layer of the chip, photomasking and CVD processes are used to deposit Gate Conductor (GC) devices. Dielectric isolation material is deposited to fill the spaces between the GC devices, and the chip is again planarized by CMP processes. Often, widely varying GC pattern density will present the same type of gate planarization problems as experienced in planarization of the dielectric isolation between active areas.

To combat gate planarization problems, non-functional GC dummy shapes that are not part of a functional circuit may be added as fill between GC devices. These GC dummy shapes must be biased at ground to avoid formation of floating nodes that can present reliability problems. Such problems include, for example, an increased risk of process-induced damage.

Although the generation of GC dummy shapes is easily automated, the biasing of these shapes to ground is more difficult to automate. For example, a metal shape at ground may not exist near the GC dummy shape, or the connection path may be blocked by other metal shapes. Moreover, selection of a metal shape at ground requires voltage information in addition to simple geometric information about the layout. For these reasons, the biasing of the GC dummy shapes is often done manually. This task it tedious when included in the original design flow; it is even more difficult when applied to a completed design that did not anticipate the use of GC dummy shapes.

To achieve global planarization of the trench isolation without the need for and cost of a planarization mask, AA dummy shapes in addition to the functional AA shapes may be added in the large trenches, similar to the GC dummy shapes. Existing schemes for implementing these AA dummy shapes have drawbacks. For example, these AA dummy shapes may create floating parasitic diodes if their implanted source and drain are not biased at the same voltage as the underlying well. To prevent this drawback, the source-drain implant mask data can be designed so that the dummy AA shapes are always either substrate or well contacts. But this design requires a significant and cumbersome modification of the implant mask data. Furthermore, the AA dummy shapes may interfere with the GC dummy shapes.

Therefore, it is an object of the present invention to provide an integrated isolation and gate planarization method that provides coordinated AA fill and GC fill, that avoids the creation of floating nodes or diodes, and that provides a high density of AA and GC dummy shapes without requiring use of an additional planarization mask. It is also an object of the present invention to provide a GC fill biasing scheme which can be easily and completely automated and which can be applied to a completed design that did not anticipate the use of GC fill. It is a further feature of the GC biasing scheme that it may be used independent of the presence of AA fill.

SUMMARY OF THE INVENTION

To achieve these and other objects, and in view of its purposes, the present invention provides a planarization method for an integrated circuit chip comprising a substrate; a plurality of wells in the substrate, each well having a boundary; a functional active area shape located in one of the wells; and a functional gate conductor shape located in a layer above the functional active area shape. The planarization method comprises preventing dishing during gate planarization by creating a dummy gate conductor shape located neither over the well boundary nor over the functional active area shape. Floating nodes are prevented by electrically biasing the dummy gate conductor shape at a predetermined voltage. The predetermined voltage may be the voltage of the well underlying the dummy gate conductor shape. Biasing may be accomplished by providing an electrically conductive path between the dummy gate conductor shape and a well contact in an active area shape in the underlying well.

The integrated circuit chip may further comprise a shallow isolation trench adjacent the functional active area shape. The planarization method may further comprise preventing dishing during planarization of the dielectric isolation between active areas by creating a dummy active area shape in the isolation trench in a location that is not beneath a future functional gate conductor shape in the gate layer and is not over the well boundary in the substrate. The planarization method may further comprise designing the dummy gate conductor shape to completely cover the dummy active area shape.

The well underlying the dummy gate conductor may further have a voltage, and the biasing step may include biasing the dummy gate conductor at the well voltage. The biasing step may alternatively comprise biasing the dummy gate conductor at a voltage different from the underlying well voltage to create a decoupling capacitor. The biasing step may further comprise placing a well contact in an active area shape and electrically connecting the dummy gate conductor shape to the well contact to form a contact cell.

Where the well under-the dummy gate conductor shape is an N-well, this connecting step includes creating a well contact of N+ material over the N-well and providing a conducting path between the dummy gate conductor shape and the well contact. Where the well under the dummy gate conductor shape is a P-well, this connecting step includes creating a well contact of P+ material over the P-well and providing a conducting path between the dummy gate conductor shape and the well contact.

The integrated circuit chip resulting from the planarization method of the subject invention comprises a substrate; a plurality of wells in the substrate, each well having a boundary; a functional active area shape in one of the wells; a functional gate conductor shape in a layer above the functional active area shape; a dummy gate conductor shape in a location that is neither over a well boundary nor over the functional active area shape; and an electrical connection between the dummy gate conductor shape and a well contact in an active area shape. The integrated circuit chip may further comprise a dummy active area shape that is completely covered by the dummy gate conductor shape.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The present invention will next be illustrated with reference to the figures in which similar numbers indicate the same elements in all of the figures. Such figures are intended to be illustrative rather than limiting and are included to facilitate the explanation of the present invention.

Figure 1A:
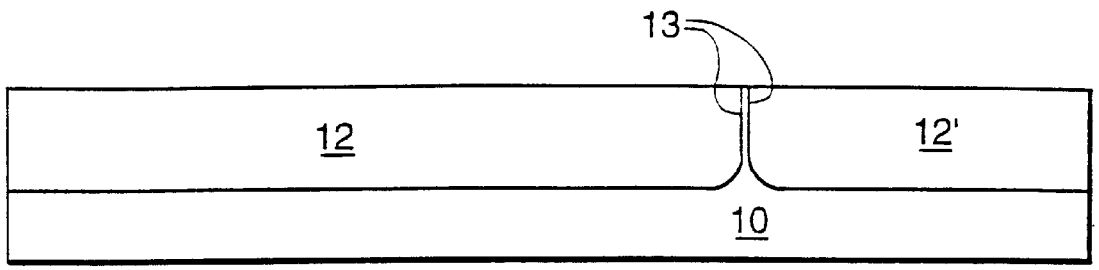
FIG. 1A is a cross-sectional illustration of a substrate having wells in the substrate.
Figure 1B:
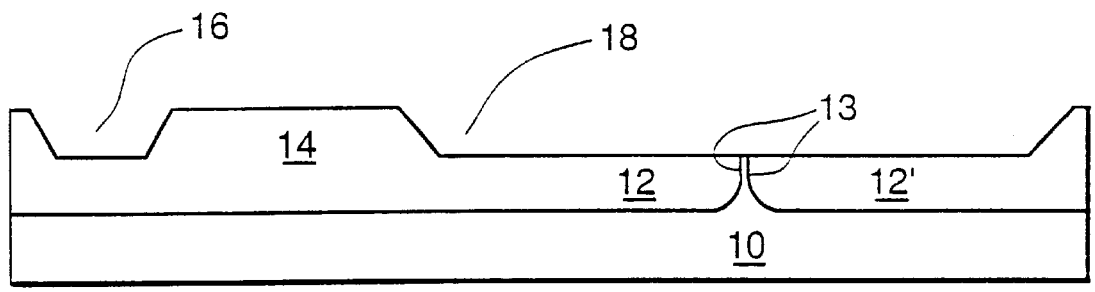
FIG. 1B is a cross-sectional illustration of the substrate of FIG. 1A with shallow trenches isolating a device Active Area (AA)

Referring first to FIG. 1A, there is shown a cross-sectional illustration of a typical chip comprising a substrate 10 prior to etching. The substrate 10 has wells 12 and 12' and well boundaries 13. FIG. 1B shows the same chip with an active area (AA) device shape 14 in well 12, and shallow isolation trenches 16 and 18 etched into the substrate to isolate AA device shape 14. Trench 18 is significantly wider than trench 16.

Typically, substrate 10 comprises P-type silicon. Well 12 may be an N-well comprising N-type silicon and well 12' may be a P-well comprising P-type silicon, or vice versa. In the semiconductor industry, a well comprising the same type of silicon as the substrate is sometimes referred to as merely the substrate and not a well at all; the well carries the same charge as the substrate and is a contact to the substrate. As used herein, however, the term "well" is intended to mean either an N-well or a P-well, and includes even a well that may comprise the same type of silicon as the substrate.

Figure 1C:
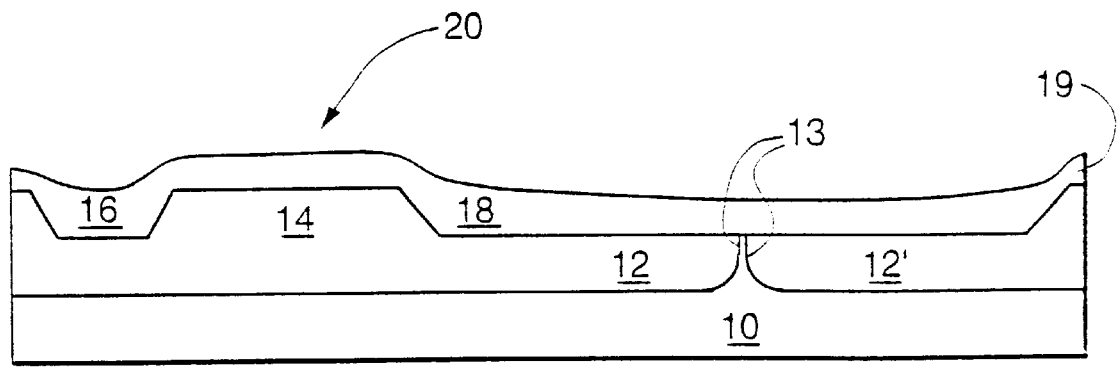
FIG. 1C is a cross-sectional illustration of the substrate of FIG. 1B with a dielectric filler in the isolating trenches as per the prior art.

Referring next to FIG. 1C depicting the prior art, there is shown the same chip as in FIG. 1B, now with a conforming layer of dielectric isolation material 19. Dielectric isolation material 19 may be silicon, silicon oxide, silicon nitride, silicon implanted with nitrogen, and the like, deposited in the trenches 16, 18 and over the active area device shape 14. The dielectric isolation material 19 is preferably deposited by a chemical vapor deposition (CVD) method. The dielectric isolation material covering AA device shape 14 forms a bump 20 in the surface of the chip. To remove the bump 20, the isolation material is then planarized, typically by a chemical mechanical polish (CMP) step.

Figure 1D:
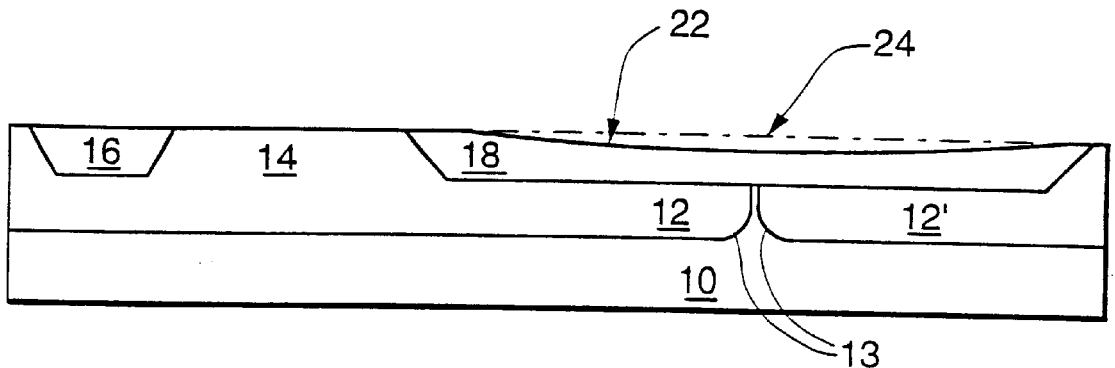
FIG. 1D is a cross-sectional illustration of the substrate of FIG. 1C after planarization as per the prior art, showing a dished area above a wide trench.

Referring next to FIG. 1D depicting the prior art, there is shown the same chip as in FIG. 1C following planarization. The isolation material has a depression 22 in the surface above wide trench 18, rather than the desired planar surface 24. This "dishing" may be caused in wide trenches by polishing pad deformation during the CMP step, when the pad is forced to bridge large gaps between the supportive structure of the active areas.

Figure 1E:
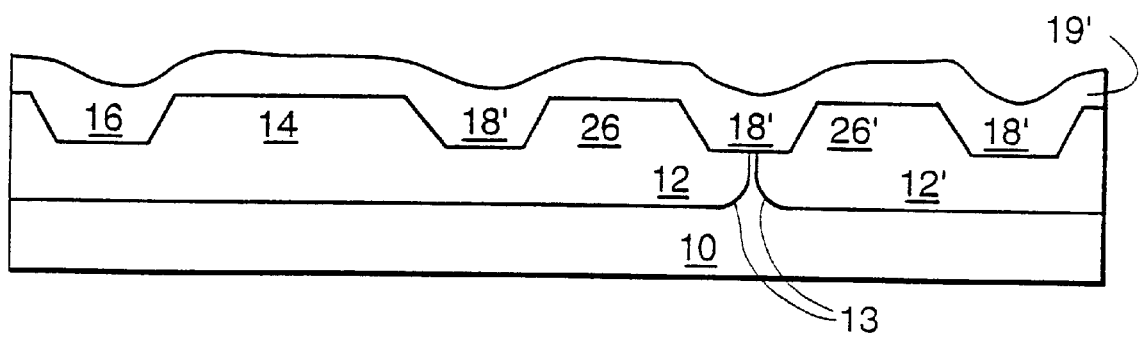
FIG. 1E is a cross-sectional illustration of the substrate of FIG. 1B with AA dummy shapes of the present invention in the shallow trenches, after application of the dielectric filler.

As shown in FIG. 1E, to prevent dishing in accordance with the present invention, a number of non-functional or "dummy" AA dummy shapes 26 and 26' are provided in former trench 18, thus splitting what was a single, relatively wide trench 18 into several narrower trenches 18'. Such dummy shapes 26, 26' may be supplied in the design stage by an automated process that inserts them wherever possible according to lithographic ground rules, except where there are active shapes already, where they would lie directly over the top of well boundaries 13, or where they would lie under functional shapes in above layers. As shown in FIG. 1E, the conforming dielectric material 19' now follows the new contour of the chip, and the chip is ready for planarization.

Figure 1F:
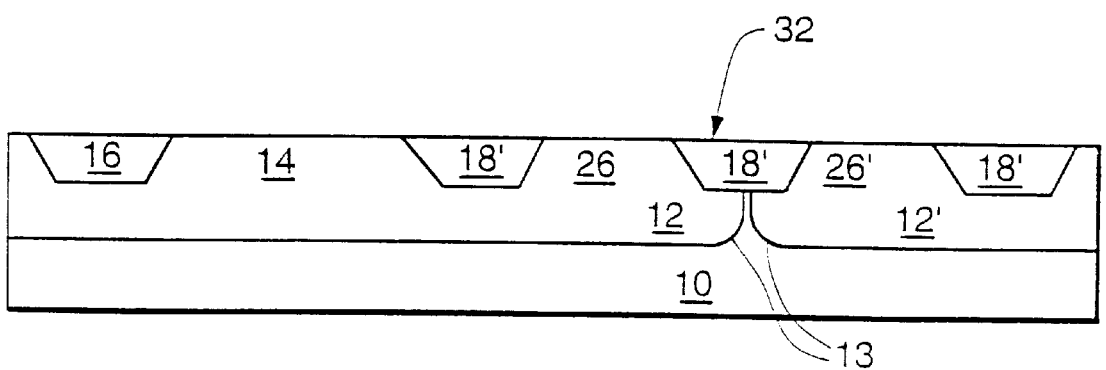
FIG. 1F is a cross-sectional illustration of the planarized substrate of FIG. 1E.

Referring next to FIG. 1F, there is shown the same chip as in FIG. 1E after planarization. Now planarization has resulted in a global planar surface 32. The AA dummy shapes 26, 26' provide a supporting structure that prevents the deformation of the polishing pad, thus preventing dishing in the isolation trenches.

Figure 2A:
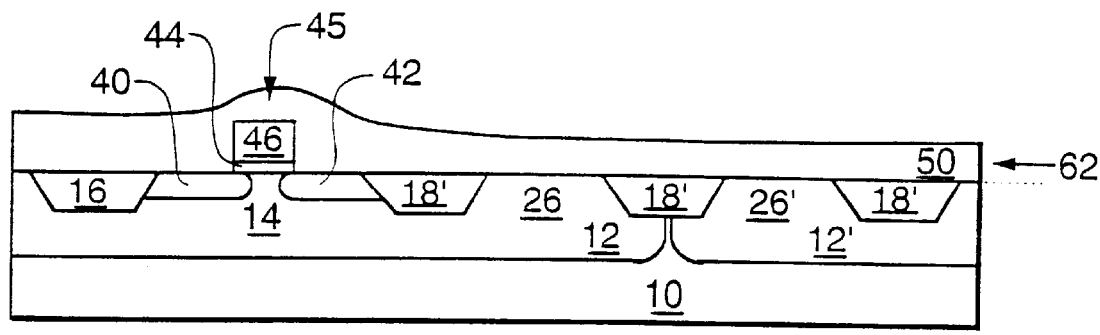
FIG. 2A is a cross-sectional illustration of the substrate of FIG. 1F having a gate layer according to the prior art with a Gate Conductor (GC) device atop the AA device and dielectric surrounding the GC device.

Referring now to FIG. 2A, following planarization of the isolation material between active areas, a source 40 and a drain 42 contact are implanted in each device active area shape 14, as is well known in the art. See, for instance, U.S. Pat. No. 5,654,570 assigned to the assignee of the present invention. FIG. 2A shows the same chip as in FIG. 1F, now having a source 40 and drain 42 implanted in AA device shape 14, and a gate conductor (GC) device shape 45 in gate layer 62 above AA device shape 14. Typically, gate conductor device shape 45 comprises a gate oxide layer 44 and a gate conductor layer 46. The GC device may also comprise a dielectric cap layer (not shown) on top of the gate conductor layer, a dielectric spacer (not shown) on each side, or both a dielectric cap layer and a dielectric spacer--as is well known in the art. The GC device may be constructed by any method and in any configuration known in the art, such method or configuration not being critical to the present invention.

Figure 2B:
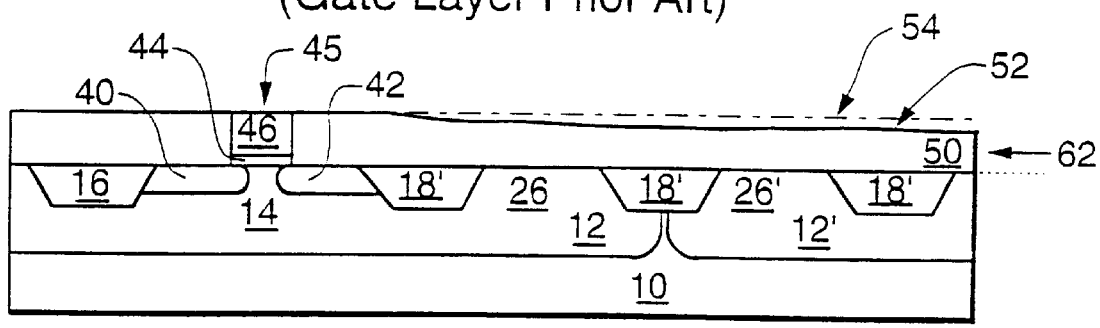
FIG. 2B is a cross-sectional illustration of the substrate of FIG. 2A after planarization of the gate layer dielectric isolation according to the prior art, showing a dished area in the area distant from the GC device.

Spaces between GC devices in gate layer 62 are typically filled with dielectric isolation material 50 by CVD or other techniques, as shown in FIG. 2A depicting a gate layer of the prior art. FIG. 2B shows the same chip as in FIG. 2A after a gate layer planarization step of the prior art. Just as a large isolation trench leaves a depression in the filled and planarized surface, a large distance between GC devices leaves a depression 52 instead of the desired planar surface 54 in the gate layer 62. This dishing is again due to deformation of the polishing pad during the CMP polishing step as it bridges large gaps between protruding gate structures.

Figure 2C:
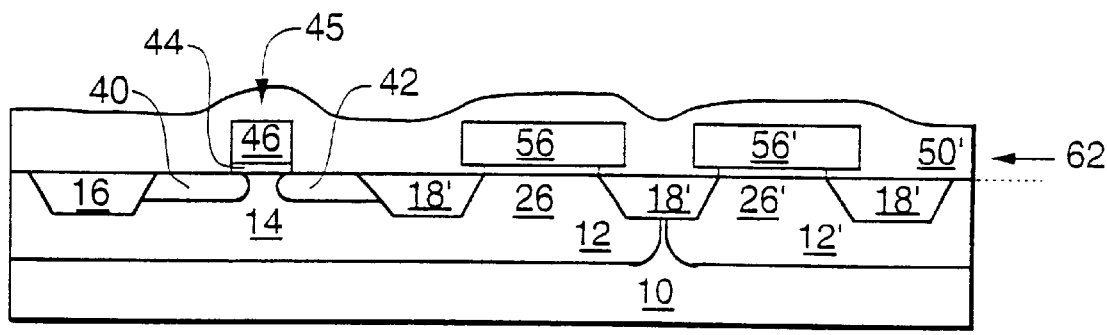
FIG. 2C is a cross-sectional illustration of the substrate of FIG. 1F having a gate layer according to the present invention, with a GC device shape atop the AA device shape as well as GC dummy shapes atop the AA dummy shapes and dielectric between and on top of the GC shapes.

FIG. 2C shows a chip that begins identical to that shown in FIG. 1F, but with GC dummy shapes 56 and 56' placed in the area previously unoccupied by any GC devices. The layout of GC dummy shapes 56, 56' follows specified ground rules that will be explained below. The GC dummy shapes 56 and 56' have all the same elements as GC device shape 45. At least one GC dummy shape 56, 56' is created over each AA dummy shape 26, 26' so that each AA dummy shape is completely covered. Dielectric isolation material 50' is then applied to fill the gaps between the GC device and dummy shapes.

Figure 2D:
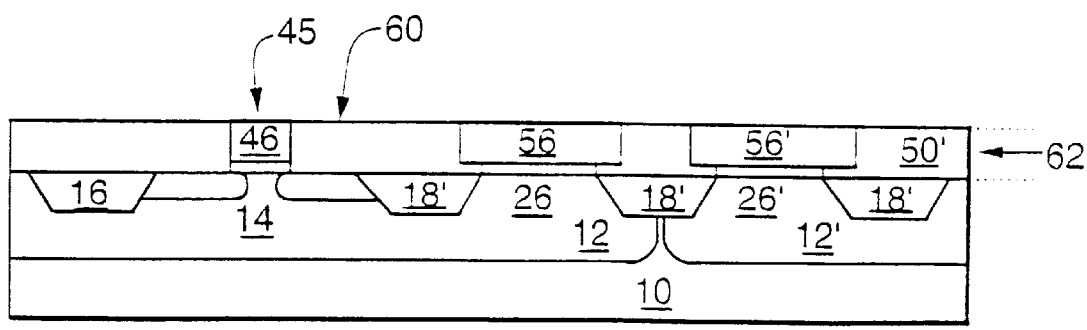
FIG. 2D is a cross-sectional illustration of the substrate of FIG. 2C after planarization.

FIG. 2D shows the chip of FIG. 2C after gate planarization. With the GC dummy shapes 56, 56' in place, the deposition of dielectric isolation material 50' and subsequent polishing produces a global planar surface 60. The dielectric isolation material between the GC shapes may extend to a specified thickness above the GC shapes, thus also forming a dielectric isolation having a planar surface above the GC shapes.

Each GC dummy shape 56, 56' is biased to the underlying well voltage to avoid creating floating nodes. Therefore, GC dummy shape 56 will be biased to well 12, whereas GC dummy shape 56' will be biased to well 12'. For the well having the same silicon composition as the substrate 10, the well voltage is the ground voltage. Biasing avoids creation of floating nodes that may cause reliability problems. Such biasing may entail manual design of wiring from each GC dummy shape to existing well or substrate contacts.

Because each active area shape is within a well in the substrate, the well voltage also extends to the active area shape and a connection to an active area shape can provide the necessary biasing. Such a biasing connection can be made using contact cells that are a further object of the present invention, discussed below.

The method of the present invention used to achieve the design described above requires coordinated creation of AA dummy shapes and GC dummy shapes in the design phase of the chip. After the functional circuit or circuits are laid out on the chip, GC dummy shapes are designed to be placed everywhere not occupied by the device GC shapes, AA device shapes, or well boundaries of the functional circuitry. Each GC dummy shape is then designed to have a bias at the voltage of the underlying well. The AA dummy shapes are designed and located so that they are completely covered by GC dummy shapes, resulting in coordinated AA-GC dummy shapes, such as 26–56 and 26'–56' shown in FIGS. 2C and 2D. In this way, both the functional AA and GC shapes as well as dummy AA and GC shapes are laid out before constructing the chip. No additional dedicated masks are required to supply AA or GC dummy shapes. After applying the layout method of the present invention, the stepwise procedure previously detailed to achieve the structure of FIG. 2D is followed.

If every AA dummy shape were not covered, a chip designer would have to modify the implant data for each AA dummy shape so that it would have the same voltage as the underlying well. Otherwise, the floating parasitic diodes created by having an implant of dissimilar voltage than its underlying well, and not connected to an associated gate or other contact, might cause reliability problems. For instance, the source and drain implanted on an AA dummy shape on top of a P-well would need P+ implants, whereas the source and drain implanted on an AA dummy shape on top of an N-well would need N+ implants. Modification of the implant data is more cumbersome than assuring that each AA dummy shape is completely covered.

Both GC and AA device shapes must obey the layout ground rules of their respective technologies. Such ground rules may be lithographic limitations that dictate the minimum or maximum width of an AA or GC device shape, and a minimum or maximum spacing from other AA or GC device shapes (device or dummy), or may be any such guidelines particular to the technology of the chip and to the processes used to manufacture the chip.

Certain planarization-techniques have difficulty with large regions of very high pattern density. Thus, GC dummy shapes may be generated in a mesh-like pattern to reduce the GC fill pattern density. Likewise, the AA dummy shapes may be broken down into a number of stripes or rectangles in order to reduce the AA fill pattern density.

In an alternate embodiment, one or more GC dummy shapes may be biased to a voltage different from the underlying well to provide a decoupling capacitor. All GC dummy shapes may be so biased, or only a portion of them, depending on the decoupling capacitance needs. The remaining GC dummy shapes, which are not biased differently from the underlying well, would then be biased the same as the underlying well. The GC dummy shapes cannot "float" in an unbiased state, however, because process-induced damage may occur during manufacturing.

Because biasing may be difficult to accomplish if the circuit design does not include an existing metal shape at the desired voltage near the GC dummy shape, a preferred embodiment of the present invention uses a design-independent gate conductor fill biasing scheme that places at least one "contact cell" within each GC dummy shape. A "cell" refers to a discrete design block that incorporates all of the elements necessary to provide the electrical contact between the GC dummy shape and the desired voltage.

Figure 3A:
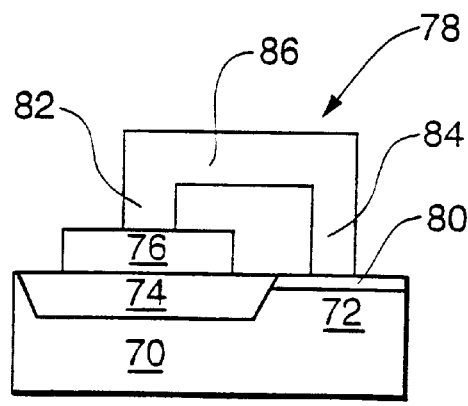
FIG. 3A is a cross-sectional illustration of a contact cell of the present invention biasing a GC shape to an AA device.

Referring next to FIG. 3A, the fill biasing scheme in its most basic form begins with a substrate 70 having an AA shape 72 isolated by a shallow trench 74 filled with dielectric material and having a GC dummy shape 76 above the trench 74. AA shape 72 may be a device AA shape or a dummy AA shape. A contact cell 78 of the present invention comprises an electrical connection between GC dummy shape 76 and a well contact 80 implanted on top of the AA shape 72. The well contact 80 is a P+ compound if the AA shape 72 is in a P-well, and is an N+ compound if the AA shape 72 is in an N-well. Where the AA shape 72 is in a well at the same voltage as the substrate 70 that is at the ground voltage, this electrical connection is essentially a grounding connection.

The electrical connection comprises a first metal contact 82 connected to the GC dummy shape 76, a second metal contact 84 connected to the well contact 80, and a contact bridge 86 in the first metal layer of the chip. The contact bridge 86 connects the first metal contact 82 and the second metal contact 84.

The contact cell 78 may be placed anywhere within the GC dummy shape as long as the placement satisfies the ground rules or blockage rules associated with the contact cell. Blockage rules ensure that the contact cell 78 does not interfere with existing shapes in the chip layout, such as in the first metal level. Ground rules may dictate a minimum distance for placement of the metal contact from the boundary of the area to be contacted. Because the contact cell 78 does not extend above the first metal level, there are no blockages above the first metal level, thus decreasing the overall likelihood of blockages restricting placement. Thus, the probability of being able to contact each GC dummy shape is high, particularly for large GC dummy shapes.

The embodiment of the biasing method shown in FIG. 3A is directed to a chip design not having coordinated GC and AA shapes. The design-independent gate conductor fill biasing planarization method may be used in any design requiring biased GC dummy shapes, even if no AA dummy shapes are coordinated with GC dummy shapes, and even if the design did not initially anticipate the use of GC dummy shapes. The use of these contact cells allows faster design of GC dummy shape biasing than prior methods, because a chip layout designer need only place each contact cell where it satisfies the layout rules rather than having to manually route each biasing connection. The computer design tools can also be programmed to automatically generate GC dummy shapes and corresponding contact cells wherever possible in accordance with the layout rules, and delete all GC dummy shapes that do not allow a contact cell.

Figure 3B:
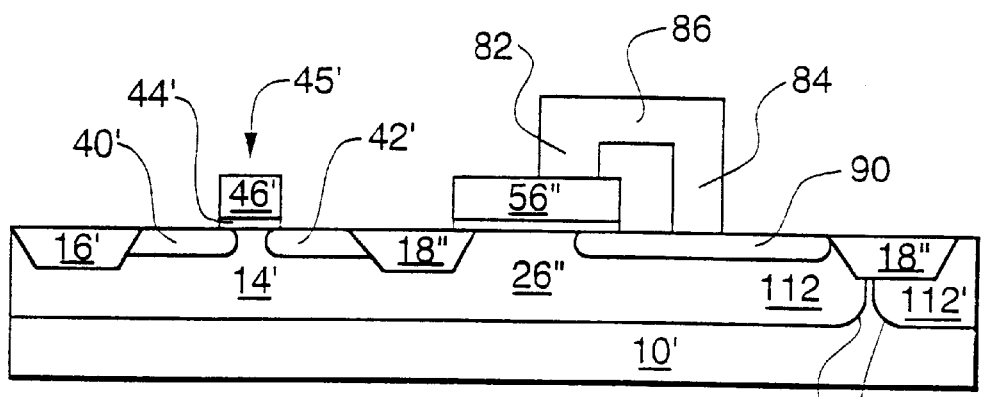
FIG. 3B is a cross-sectional illustration of contact cells of the present invention used to bias a GC dummy shape to an underlying AA dummy shape.

Referring next to FIG. 3B, there is shown an embodiment of the contact cell used in conjunction with the coordinated isolation and gate planarization method. FIG. 3B shows how dummy GC shapes can be biased to dummy AA shapes with a contact cell. The chip shown in FIG. 3B comprises substrate 10', having wells 112 and 112' in the substrate 10' with well boundaries 113, and a functional active area 14' surrounded by isolation trenches 16' and 18". Implant source 40' and drain 42' are located in active area 14', and gate conductor 45' comprising gate oxide layer 44' and gate conductor layer 46' is located atop AA device shape 14'. Dummy AA shape 26" is located in trench 18", and dummy GC shape 56" is located on AA shape 26".

Well contact 90 is implanted in the AA dummy shape 26" in the area not covered by GC dummy shape 56', with one end of the well contact 90 extending slightly underneath the GC dummy shape 56'. Well contact 90 in AA dummy shape 26" is a P+ compound if well 112' is a P-well, and an N+ compound if well 112' is an N-well. To prevent formation of floating parasitic diodes, the surface layer of each AA shape is completely covered by either a well contact, a GC dummy shape, or a combination of GC dummy shapes and well contacts.

For the same reasons provided above, AA shapes are completely covered. The process of assuring that each AA shape is completely covered is less cumbersome than modifying implant data for each dummy AA shape. Where contact cells are used, the designer need only specify the implant data for the implant mask associated with the contact cells (which can be automated).

The electrical connection of the embodiment illustrated in FIG. 3B also comprises a first metal contact 82 connected to the GC dummy shape, a second metal contact 84 connected to the well contact, and a contact bridge 86 in the first metal layer of the chip. The contact bridge 86 connects the first and second metal contacts.

Although each AA dummy shape must be completely covered by a GC dummy shape, a well contact, or some combination of GC dummy shapes and well contacts, the GC dummy shapes do not have to be located on top of AA dummy shapes. Thus, GC dummy shapes may be located in areas not directly above AA dummy shapes as illustrated in FIG. 3A. A GC dummy shape without an underlying AA dummy shape may arise when the ground rules allow a GC dummy shape in an area where the ground rules will not allow an underlying AA dummy shape. Because each GC dummy shape is biased, this does not create reliability problems.

Thus, a chip embodying the present invention may have some combination of GC dummy shapes and AA dummy shapes, with some GC dummy shapes located on top of AA dummy shapes and some located on top of isolation trenches. In addition, some AA dummy shapes may be completely covered by GC dummy shapes, others may be completely covered by well contacts, and still others may be completely covered by some combination of GC dummy shapes and well contacts.

Figure 3C:
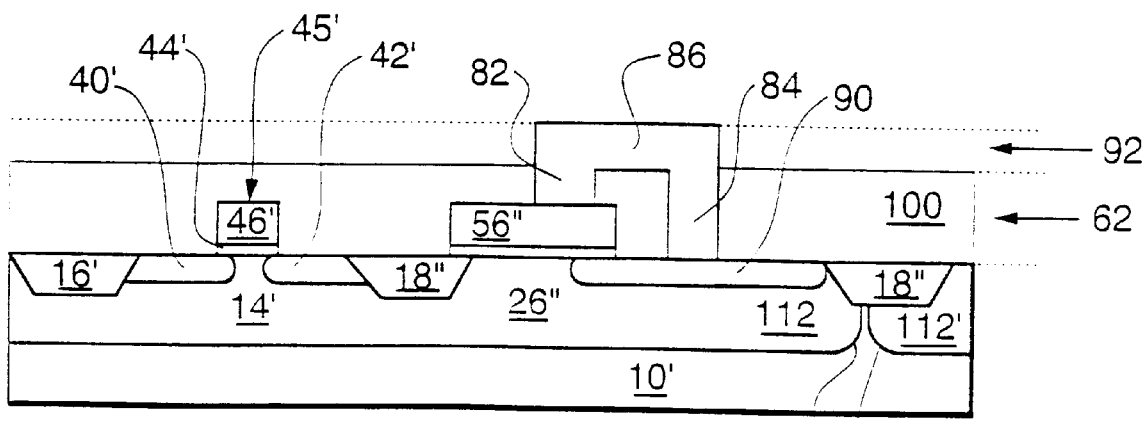
FIG. 3C is a cross-sectional illustration of the substrate and associated regions of FIG. 3B after application of the dielectric and the first metal layer.

Referring next to FIG. 3C, there is shown the chip of 3B, further comprising dielectric fill 100 in gate layer 62 and extending to the first metal layer 92. Each layer or region may comprise other sub-regions or sub-layers. To manufacture the contact cells, holes for first metal contact 82 and second metal contact 84 are formed in the dielectric fill 100 between the gate layer and the metal layer until GC dummy shape 56' and well contact 90, respectively, are reached. Upon application of the first metal layer, metal fills the holes so formed, creating metal contacts 82 and 84, respectively, and contact bridge 86 is formed between the first metal contact 82 and the second metal contact 84 to complete the connection.

Thus, coordinated GC and AA dummy shapes may be biased using the contact cells of the present invention by the following method. First, a functional integrated circuit layout is designed, comprising a plurality of wells in the substrate each having a boundary, a plurality of device active area shapes having isolating shallow trenches between them, and a plurality of device gate conductor shapes above the device active area shapes. Next, a plurality of gate conductor dummy shapes are generated in locations unoccupied by device gate conductor shapes, underlying device active area shapes, or underlying well boundaries. Next, a plurality of active area dummy shapes are generated in the shallow trenches according to ground rules and underlying the GC dummy shapes. Each gate conductor dummy shape that can accommodate a contact cell is then biased with at least one contact cell, and each gate conductor dummy shape not accommodating a contact cell is deleted. Each AA shape is designed to be completely covered by a gate conductor dummy shape or a well contact, or by a combination of one or more gate conductor dummy shapes and one or more well contacts.

Although illustrated and described above with reference to certain specific embodiments, the present invention is nevertheless not intended to be limited to the details shown. Rather, various modifications may be made in the details within the scope and range of equivalents of the claims and without departing from the spirit of the invention. In particular, the method of the present invention may be automated to provide a high density of desired dummy shapes and associated biasing to avoid creation of floating nodes.

What is claimed is:

1. An integrated circuit chip comprising:

a substrate having a plurality of wells each defined by a boundary;

a functional active area shape located in one of said wells having a well contact;

a layer above said functional active area shape;

a functional gate conductor shape in said layer above said functional active area shape;

a dummy gate conductor shape neither over a well boundary nor over the functional active area shape; and an electrical connection between the dummy gate conductor shape and the well contact in the functional active area shape.

2. The integrated circuit chip according to claim 1 wherein an N-well underlies said dummy gate conductor shape and the well contact is N+ material.

3. The integrated circuit chip according to claim 1 wherein a P-well underlies said dummy gate conductor shape and the well contact is P+ material.

4. The integrated circuit chip according to claim 1 further comprising a dummy active area shape under said dummy gate conductor shape, wherein said dummy active area shape is completely covered by at least one dummy gate conductor shape and at least one well contact.

* * * * *